United States Patent
Oggier et al.

(10) Patent No.: US 8,829,408 B2
(45) Date of Patent: Sep. 9, 2014

(54) SENSOR PIXEL ARRAY AND SEPARATED ARRAY OF STORAGE AND ACCUMULATION WITH PARALLEL ACQUISITION AND READOUT WHEREIN EACH PIXEL INCLUDES STORAGE SITES AND READOUT NODES

(71) Applicant: MESA Imaging AG, Zurich (CH)

(72) Inventors: Thierry Oggier, Zurich (CH);
Bernhard Buettgen, Adliswil (CH)

(73) Assignee: MESA Imaging AG, Zurich (CH)

( * ) Notice: Subject to any disclaimer, the term of this patent is extended or adjusted under 35 U.S.C. 154(b) by 211 days.

(21) Appl. No.: 13/628,300

(22) Filed: Sep. 27, 2012

(65) Prior Publication Data
US 2013/0140433 A1    Jun. 6, 2013

Related U.S. Application Data

(60) Provisional application No. 61/539,591, filed on Sep. 27, 2011.

(51) Int. Cl.
*H01L 27/00* (2006.01)
*H01L 27/146* (2006.01)
*G01S 7/491* (2006.01)
*G01S 17/89* (2006.01)

(52) U.S. Cl.
CPC ............. *H01L 27/146* (2013.01); *G01S 7/4914* (2013.01); *G01S 17/89* (2013.01)
USPC .................................. 250/208.1; 250/214 R (58) Field of Classification Search
USPC ........ 250/214 R, 208.1, 214.1; 348/296–311; 257/290–292, 440
See application file for complete search history.

(56) References Cited

U.S. PATENT DOCUMENTS

| | | | |
|---|---|---|---|
| 5,856,667 A | 1/1999 | Spirig et al. | |
| 6,486,503 B1 * | 11/2002 | Fossum | 257/215 |
| 6,825,455 B1 | 11/2004 | Schwarte | |
| 7,462,808 B2 | 12/2008 | Lustenberger et al. | |
| 7,498,621 B2 | 3/2009 | Seitz | |
| 2002/0084430 A1 | 7/2002 | Bamji et al. | |
| 2008/0239466 A1 | 10/2008 | Buettgen | |
| 2011/0164132 A1 | 7/2011 | Buettgen et al. | |

FOREIGN PATENT DOCUMENTS

EP         1513202 A1    3/2005
WO    2011085079 A1    7/2011

OTHER PUBLICATIONS

Buettgen, B. "Extending Time-of-Flight Optical 3D-Imaging to Extreme Operating Conditions," A dissertation submitted to the Faculty of Science of the University of Neuchatel for the degree of Doctor of Sciences, 2006, 209 pages.

Buettgen, B. et al., "Demodulation Pixel Based on Static Drift Fields," IEEE Transactions on Electron Devices, vol. 53, No. 11, Nov. 2006, 2741-2747.

(Continued)

*Primary Examiner* — Que T Le
(74) *Attorney, Agent, or Firm* — Houston & Associates LLP (57) ABSTRACT

A demodulation image sensor, such as used in time of flight (TOF) cameras, performs the acquisition and readout of the pixels in parallel. This is used to avoid motion artifacts due to samplings performed separated in time.

17 Claims, 5 Drawing Sheets

(56) References Cited

OTHER PUBLICATIONS

Durini, D. et al., "Lateral drift-field photodiode for low noise, high-speed, large photoactive-area CMOS imaging applications," Nuclear Instruments and Methods in Physics Research Section A, vol. 624, No. 2, 2010, pp. 470-475.

Oggier, T. et al., "An all-solid-state optical range camera for 3D real-time imaging with sub-centimeter depth resolution (SwissRangerTM)," SPIE, vol. 5249, 2004, pp. 534-545.

Oggier, T. et al., "Novel Pixel Architecture with Inherent Background Suppression for 3D Time-of-Flight Imaging," SPIE, vol. 5665, Jan. 2005, pp. 1-8.

Tubert, C. et al., "High Speed Dual Port Pinned-photodiode for Time-of-Flight Imaging," International Image Sensor Workshop, 2009, Bergen, Norway, 3 pages.

\* cited by examiner

SENSOR PIXEL ARRAY AND SEPARATED ARRAY OF STORAGE AND ACCUMULATION WITH PARALLEL ACQUISITION AND READOUT WHEREIN EACH PIXEL INCLUDES STORAGE SITES AND READOUT NODES

RELATED APPLICATIONS

This application claims the benefit under 35 U.S.C. 119(e) of U.S. Provisional Application No. 61/539,591, filed on Sep. 27, 2011, which is incorporated herein by reference in its entirety.

BACKGROUND OF THE INVENTION

Electronic imaging sensors usually have an array of m×n photo-sensitive pixels, with m>=1 rows and n>=1 columns. Each pixel of the array can individually be addressed by dedicated readout circuitry for column-wise and row-wise selection. Optionally a block for signal post-processing is integrated on the sensor.

The pixels typically have four basic functions: photo detection, signal processing, information storage, and analog or digital conversion. Each of these functions consumes a certain area on the chip.

A special group of smart pixels, called demodulation pixels, is well-known for the purpose of three dimensional (3D) time of flight (TOF) imaging. Other applications of such demodulation pixels include fluorescence life-time imaging (FLIM). The pixels of these demodulation imaging sensors typically demodulate the incoming light signal by means of synchronous sampling or correlating the signal. Hence, the signal processing function is substituted more specifically by a sampler or a correlator. The output of the sampling or correlation process is a number n of different charge packets or samples (A0, A1, A3 . . . An−1) for each pixel. Thus, n storage sites are used for the information storage. The typical pixel output in the analog domain is accomplished by standard source follower amplification. However, analog to digital converters could also be integrated at the pixel-level.

The image quality of demodulation sensors is defined by the per-pixel measurement uncertainty. Similar to standard 2D imaging sensors, a larger number of signal carriers improves the signal-to-noise ratio and thus the image quality. For 3D imaging sensors, more signal carriers mean lower distance uncertainty. In general, the distance measurement standard deviation σ shows an inverse proportionality either to the signal A or to the square root of the signal, depending whether the photon shot noise is dominant or not.

$$\sigma \propto \frac{1}{\sqrt{A}} \text{ if photon shot noise is dominant}$$

$$\sigma \propto \frac{1}{A} \text{ if other noise sources are dominant}$$

A common problem for all demodulation pixels used in demodulation sensors, such as for TOF imaging or FLIM, or otherwise, arises when trying to shrink the pixel size to realize arrays of higher pixel counts. Since the storage nodes require a certain area in the pixel in order to maintain adequate full well capacity and thus image quality, the pixel's fill factor suffers from the shrinking process associated with moving to these larger arrays. Thus, there is a trade-off between the storage area needed for obtaining a certain image quality and the pixel's photo-sensitivity expressed by the fill-factor parameter. In the case of a minimum achievable image quality, the minimum size of the pixel is given by the minimum size of the total storage area.

In 3D imaging, typically a few hundreds of thousands up to several million charge carriers, i.e. typically electrons, need to be stored in order to achieve centimeter down to millimeter resolution. This performance requirement, in turn, means that the storage nodes typically cover areas of some hundreds of square micrometers in the pixel. Consequently, pixel pitches of 10 micrometers or less become almost impossible without compromises in terms of distance resolution and accuracy.

The aforementioned trade-off problem becomes even more critical if additional post-processing logic is to be integrated on a per-pixel basis. Such post-processing could include for example analog-to-digital conversion, logic for a common signal subtraction, integrators, and differentiators, to list a few examples.

Another challenge of the demodulation pixels is the number of samples required to unambiguously derive the characteristics of the impinging electromagnetic wave. Using a sine-modulated carrier signal, the characteristics of the wave are its amplitude A, the offset B and the phase P. Hence, in this case, at least three samples need to be acquired per period. However, for design and stability reasons, most common systems use four samples. Implementing a pixel capable of capturing and storing n=4 samples requires in general the four-fold duplication of electronics per pixel such as storage and readout electronics. The result is the further increase in the electronics per pixel and a further reduction in fill factor.

In order to avoid this loss in sensitivity, most common approaches use so-called 2-tap or 2-channel pixels, which are demodulation pixels able to sample and store two samples within the same period. Such type of pixel architectures are ideal in terms of sensitivity, since all the photo-electrons are converted into a signal and no light is wasted, but on the other hand, it requires at least two consequent measurements to get the four samples. Due to sampling mismatches and other non-idealities, even four images might be required to cancel or at least to reduce pixel mismatches. Such an approach has been presented by Lustenberger, Oggier, Becker, and Lamesch, in U.S. Pat. No. 7,462,808, entitled Method and device for redundant distance measurement and mismatch cancellation in phase measurement systems, which is incorporated herein by this reference in its entirety. Having now several images taken and combined to deduce one depth image, motion in the scene or a moving camera renders artifacts in the measured depth map. The more those different samples are separated in time, the worse the motion artifacts are.

A new architecture has been disclosed by Oggier and Buettgen in U.S. Pat. Pub. No. 2011/0164132A1. The architecture enables the shrinking of the pixel size without significantly reducing the pixel's fill factor and without compromising the image quality due to smaller storage nodes. The solution even provides the possibility for almost arbitrary integration of any additional post-processing circuitry for each pixel's signals individually. Furthermore, it can reduce the motion artifacts of time-of-flight cameras to a minimum. Specifically, this demodulation sensor comprises a pixel array comprising pixels that each produce at least two samples and a storage or proxel array comprising processing and/or storage elements, each of the storage elements receiving the at least two samples from a corresponding one of the pixels. The pixels comprise photosensitive regions in which incoming light generates charge carriers and demodulators/correlators that transfer the charge carriers among multiple storage sites in the pixels. A transfer system is provided that transfers the samples generated by the pixels to the corresponding storage elements of the proxel array. In example embodiments, the transfer system analog to digitally converts the samples received by the storage elements. The proxel array then accumulates multiple subframes in time until the entire frame is readout from the proxel array.

SUMMARY OF THE INVENTION

One of the biggest challenges in TOF imaging concerns the reliable acquisition of fast moving objects. Since the most sensitive demodulation pixel is based on a so-called 2-tap pixel (two storage and output sites per pixel), several acquisitions have to be performed to get depth information. During these acquisitions, the object might move and, hence, the each pixel might not sample of the same object. The derived depth measurement result will, thus, be corrupted.

The present invention concerns an approach for increasing the processing speed of these sensors by enabling acquisition and readout of the pixels in parallel or in a more parallel fashion.

In general, according to another aspect, the invention features a demodulation sensor, which comprises a pixel array comprising pixels that each produce at least two signals for subframes and a storage array comprising storage elements, each of the storage elements receiving the at least two signals from a corresponding one of the pixels. The pixels each comprise storage sites and readout nodes in which charge carriers are integrated in the storage sites and then transferred to the readout nodes for readout to the storage array.

In the preferred embodiment, storage sites integrate charge carriers while the charge carriers are being readout from the readout nodes. For example, storage sites integrate charge carriers for a current integration time while the charge carriers are being readout from the readout nodes from a previous integration time.

In general, according to another aspect, the invention features a demodulation method, comprising: producing at least two samples with a pixel array in storage sites, transferring the samples to readout nodes within each of the pixels in the pixel array and reading out the samples from the readout nodes to a storage array.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
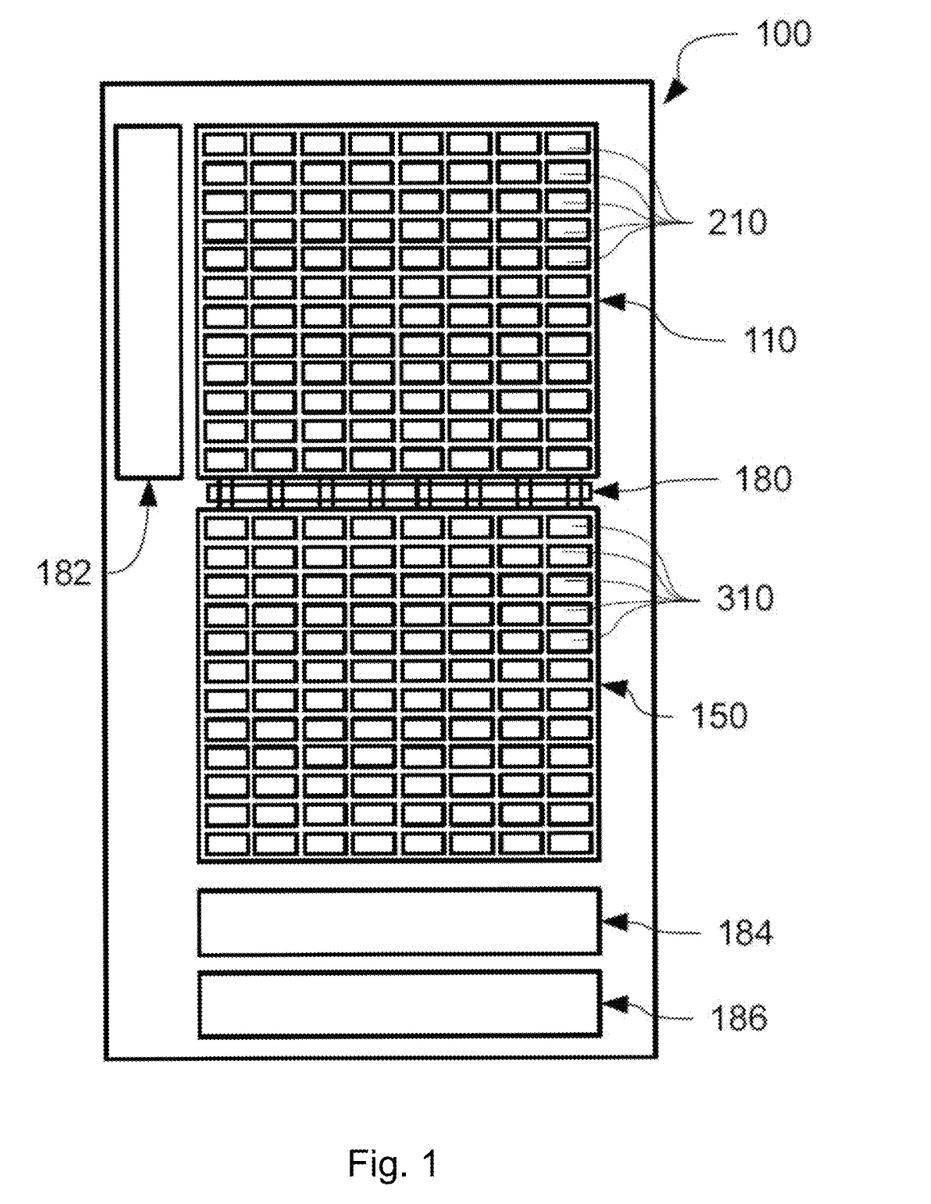
FIG. 1 is a schematic diagram showing an electronic imaging sensor including a photo-sensitive pixel array and a separate storage or proxel array, which provides final frame storage and readout capability for each pixel.

FIG. 1 shows a demodulation sensor 100 that uses a proxel array.

The illustrated architecture extracts elements, which are typically integrated inside the pixel but not necessarily required for the photo detection, out of the pixel into physically separated elements that are basically storage and sometimes processing elements, termed storage elements or proxels. As a consequence, the sensor includes a pixel array 110 of x×y pixels and a storage or proxel array 150 of x×y of storage elements or proxels 310 that are used for further processing, storage of the information and readout. Usually x and y are greater than 100, and preferably greater than 200. In some examples x, y are greater than 1000. The two arrays are physically separated from each other in preferably discrete arrays that do not physically overlap with each other on the chip.

Subframe accumulation is handled in this proxel array 150. Thus, the sensor 100 includes the pixel array 110 and the proxel array 150, where each proxel 310 is linked to and associated with preferably one particular pixel 210.

It is worth mentioning that the proxel array 150 does not have to be one contiguous array. In examples the proxel array 150 is split into two, three, or four matrices that surround the pixel array 110.

The data transfer of the pixel 210 to the proxel 310 is controlled by the pixel readout decoder 182 and transferred through the transfer or connection system 180. The pixel readout decoder 182 selects the pixel 210 and establishes the connection 180 to the corresponding proxel 310. Preferably, the readout of the pixel field 110 is done row-wise. This happens during the pixel array or field readout that occurs during each subframe. Hence, the readout decoder selects at least one row of the pixel field 110 which is then connected to the corresponding rows of proxels 310 in the proxel field 150. In that case, the connection lines of the transfer or connection system 180 are shared by all pixels in a column. In order to further speed up the pixel readout, multiple rows could be selected and transferred as well.

Additionally included in the sensor 100 is the proxel readout decoder 186 for controlling the readout of the proxels. An optional signal post processing block 184 is provided for calculating phase/depth information based on the n acquired samples, for example. Further the readout is typically provided off of then sensor chip.

In one example, the transfer or connection system 180 between the pixel array 110 and the proxel array 150 includes analog to digital converters. The information arriving and processed at the proxel array is therefore digital.

Figure 2:
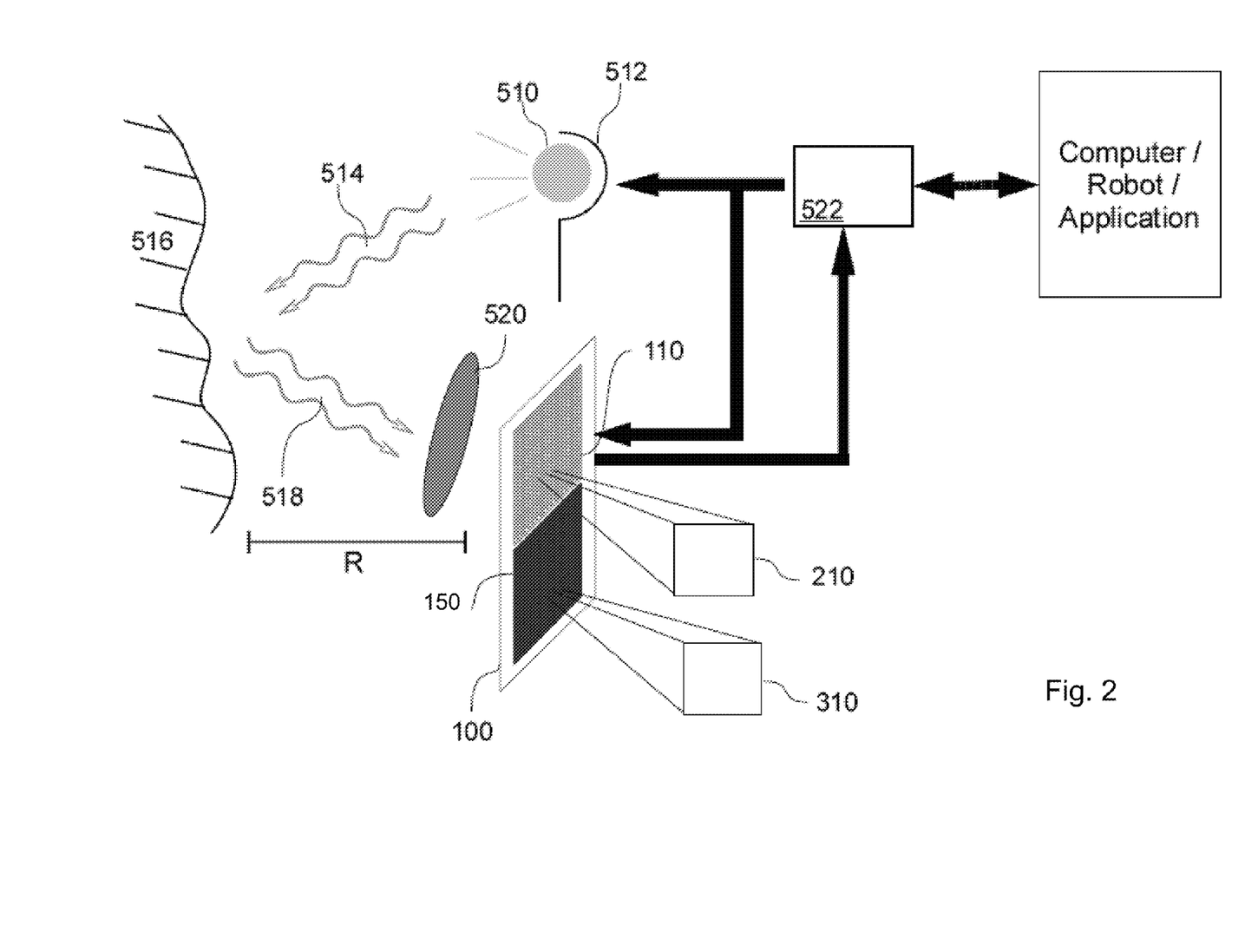
FIG. 2 illustrates the basic principle of time-of-flight cameras.

FIG. 2 shows the typical application of a 3D TOF camera that uses the inventive sensor 100.

In more detail, a light source or emitter 510 with a possible reflector or projection optics 512 produces light 514 that is intensity-modulated in time and directed at the 3-D scene 516 at range R from the camera. The returning light 518 from the scene 516 is collected by the objective lens system 520 and possibly bandpass filtered so that only light at the wavelength emitted by the light emitter 510 is transmitted. An image is formed on the pixel array 110 of the TOF sensor 100. A control unit 522 coordinates the modulation of the light emitter 510 with the sampling of the TOF detector chip 100. This results in synchronous demodulation. That is, the samples that are generated in each of the pixels 210 of the pixel array 110 are stored in the storage buckets or sites in the pixels and/or proxels 310 in the storage or proxel array 150 synchronously with the modulation of a light emitter 510. The kind of modulation signal is not restricted to sine but for simplicity, sine wave modulation only is used for illustration.

The information or samples are transferred to the storage or proxel array 150 and then readout by the control unit 522, which then reconstructs the 3-D image representation using the samples generated by the chip 100 such that a range r to the scene is produced for each of the pixels of the chip 100.

In the case of sine wave modulation, using the n=4 samples A0, A1, A2, A3 generated by each pixel/proxel, the three decisive modulation parameters amplitude A, offset B and phase shift P of the modulation signal are extracted by the equations:

$$A = \text{sqrt}\ [(A3-A1)^2+(A2-A1)^2]/2$$

$$B = [A0+A1+A2+A3]/4$$

$$P = \arctan\ [(A3-A1)/(A0-A2)]$$

With each pixel 210 of the sensor 100 being capable of demodulating the optical signal at the same time, the controller unit 522 is able to deliver 3D images in real-time, i.e., frame rates of up to 30 Hertz (Hz), or even more, are possible. Continuous sine modulation delivers the phase delay (P) between the emitted signal and the received signal, which corresponds directly to the distance R:

$$R = (P*c)/(4*\text{pi}*f\text{mod}),$$

where fmod is the modulation frequency of the optical signal 514. Typical state-of-the-art modulation frequencies range from a few MHz up to a few hundreds of MHz or even GHz.

Figure 3:
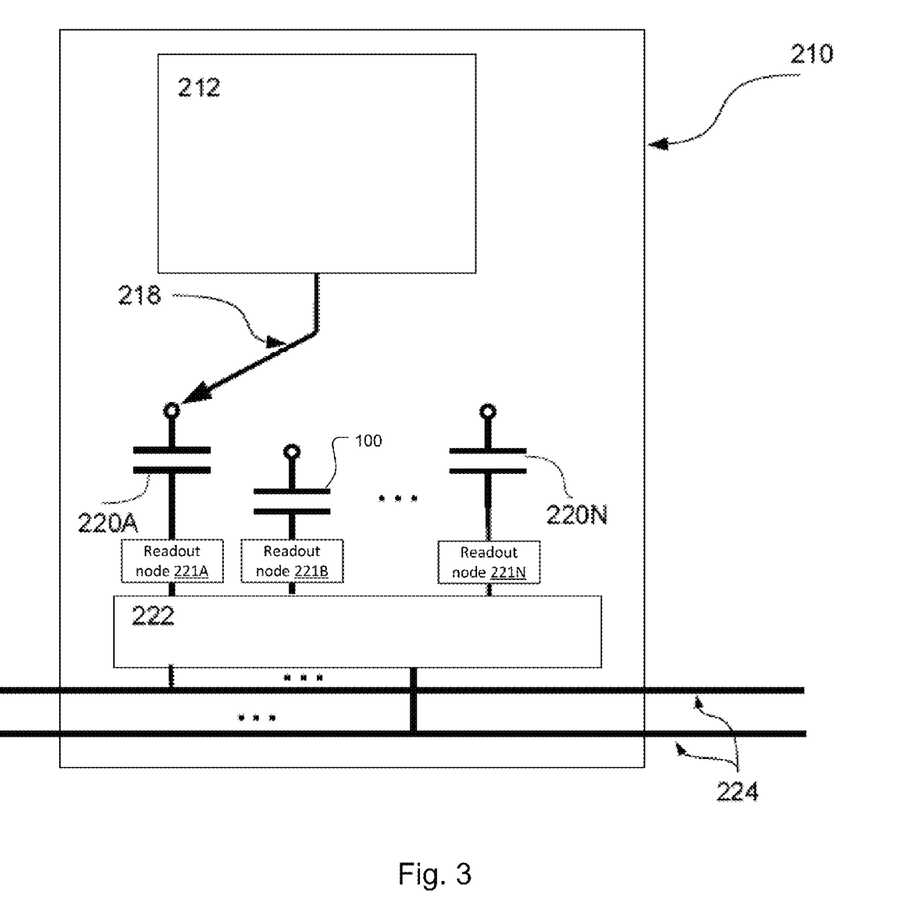
FIG. 3 is a block diagram showing the functions of a demodulation pixel according to the present invention.

FIG. 3 illustrates a demodulation pixel 210 with its different functional blocks. The impinging light is converted in charge carriers in the photo-sensitive area 212 of the pixel 210. Typically a lateral electrical drift field is provided in the photo-sensitive area 212 to sweep the charge carriers to a demodulator/correlator 218, which transfers the photo-generated charges in an alternating fashion to the n different storage sites 220A, 220B to 220N, which accumulate the charges generated in each subframe. The transfer to the different storage sites 220A, 220B to 220N is typically performed synchronously with the modulation of the light source 510.

The illustrated example shows a pixel with N storage sites, but in most conventional pixels, N=2.

The charge carriers are accumulated in the storage sites 220A, 220B to 220N for the integration time set by for the sensor. Typically this time is between a few tens of microseconds up to a few hundreds of milliseconds.

At the end of this pixel integration time, the charge carriers accumulated in each of the storage sites 220A, 220B to 220N are transferred to corresponding readout nodes 221A, 221B to 221N in an in-pixel charge transfer process. These hold the charge carriers until they can be read out on the readout lines out of the pixel array 110 in a pixel array or field readout process. Relevant here, however, is the fact that once the charge carriers are transferred to the readout nodes 221A, 221B to 221N, the storage sites 220A, 220B to 220N are immediately available to receive new charge carriers for the next pixel integration time. This integration cycle begins even before the charges have been read out from the readout nodes 221A, 221B to 221N from the previous integration time.

Before reading out the readout nodes 221A, 221B to 221N with the n samples, many demodulation pixels include in-pixel processing 222 e.g. for common mode suppression.

The pixels' storage nodes and separate readout out nodes are usually designed as a storage MOS gate and an output diffusion, respectively. During integration, the electrons are stored in the storage sites 220A-220N. At the end of the integration, the charges are shifted to the readout nodes 221A-221N and the storage sites are emptied.

The sensing 212 and demodulation 218 can be done using dynamic lateral drift fields as described in U.S. Pat. No. 7,498,621 B2, which is incorporated herein in its entirety, or static lateral drift fields as described in U.S. Pat. Appl. No. 2008/0239466 A1, which is incorporated herein in its entirety. Various approaches have been published based on the static lateral drift field principle B. Büttgen, F. Lustenberger and P. Seitz, Demodulation Pixel Based on Static Drift Fields, IEEE Transactions on Electron Devices, 53(11):2741-2747, November 2006, Cédric Tubert et al., High Speed Dual Port Pinned-photodiode for Time-Of-Flight Imaging, International Image Sensor Workshop Bergen 2009, and D. Durini, A. Spickermann, R. Mahdi, W. Brockherde, H. Vogt, A. Grabmaier, B. Hosticka, "Lateral drift-field photodiode for low noise, high-speed, large photoactive-area CMOS imaging applications", Nuclear Instruments and Methods in Physics Research A, 2010. Other methods do not have the photosensitive area 212 and the demodulation 218 physically separated such as the photo-detection assisted by switching majority currents, see M. Kuijk, D. van Niewenhove, "Detector for electromagnetic radiation assisted by majority current", September 2003, EP 1 513 202 A1, or the methods based on toggling large transfer gates, see U.S. Pat. Nos. 5,856,667, 6,825,455, and US 2002/0084430A1. All of those sensing/demodulation methods can be implemented here.

Figure 4:
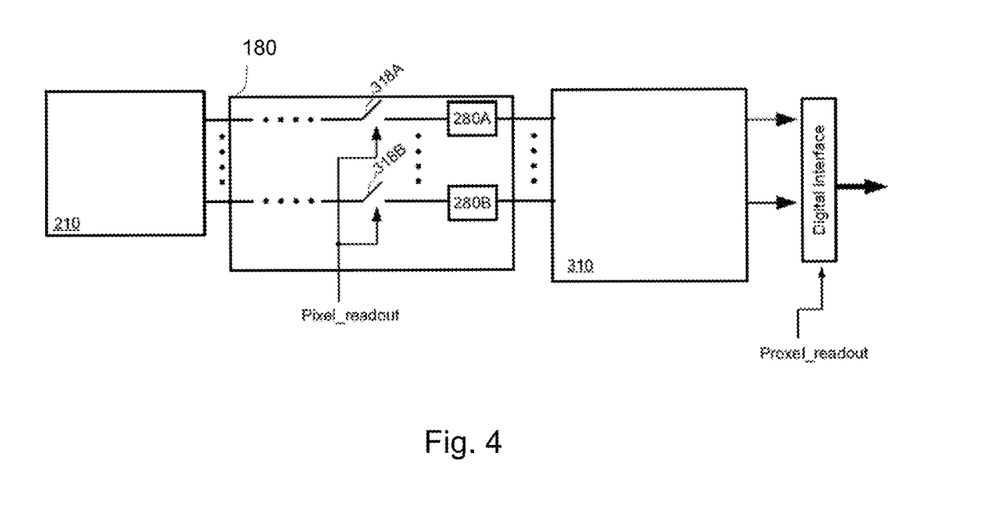
FIG. 4 is a block diagram showing an example of a pixel to proxel transfer or connection system.

FIG. 4 shows the pixel to proxel transfer or connection system 180 converting the information into the digital domain, according to one embodiment. There is one analog to digital converter 280A, 280B per output line. The Pixel readout signal, controlled by the pixel readout decoder 182, provides the analog signals from readout nodes 221A-221N of the pixels 210 to the converters 280A, 280B, which analog to digital convert the charges accumulated into digital values. In other embodiment, there is no analog to digital converters in the proxel transfer or connection system 180 and the charge carriers are stored in separate storage sites even in the proxel array 150.

Figure 5:
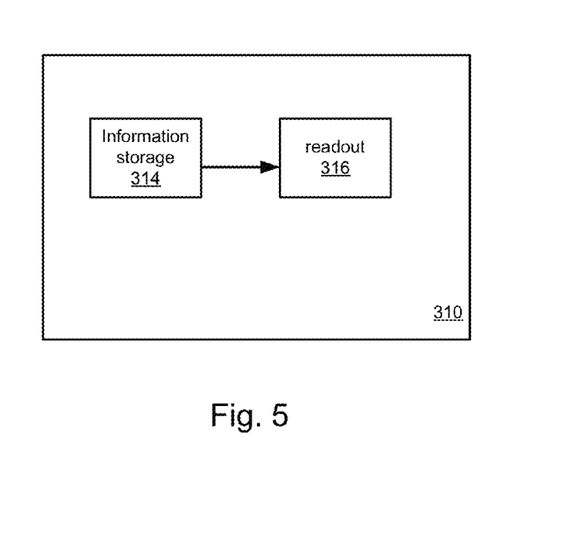
FIG. 5 is a block diagram showing the functions of a proxel.

FIG. 5 shows the functions of the storage elements or proxels 310. An information storage unit 314 accumulates each of the subframes of generated information that are readout from the pixel array and provides typically four different storage locations for each of the four samples A1-A4 that are taken at 0, 90, 180, and 270 degrees of phase shift that are generated within a subframe. A data readout unit 316 enables the information readout typically at the time of the depth calculation and off-chip readout process. In any event, instead of reading out the pixel matrix 110 directly, the proxel array 150 is readout.

Figure 6:
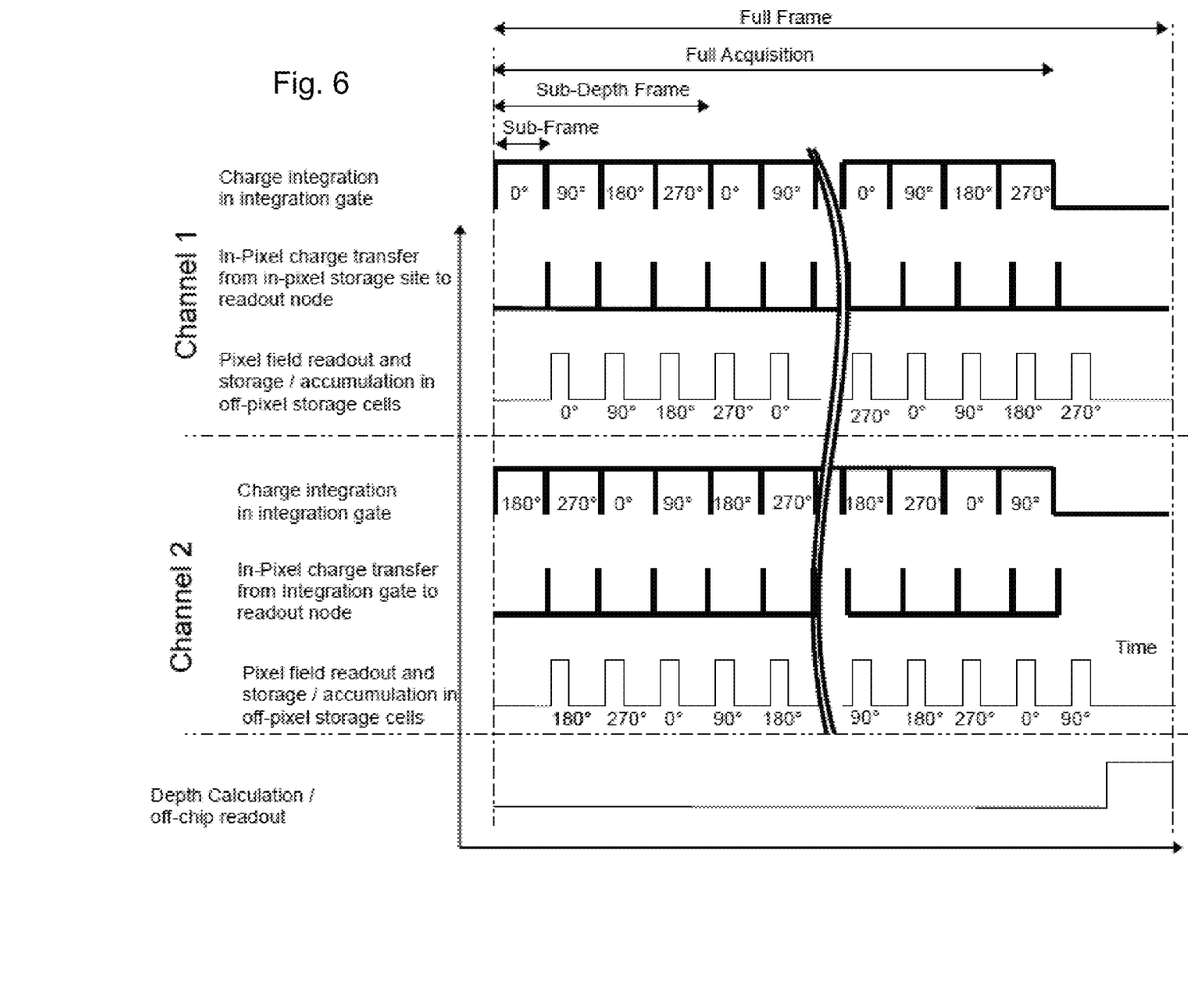
FIG. 6 shows a timing of a 3D image acquisition showing parallel integration and readout based system architecture with a pixel field array and a storage/accumulation proxel array based on a 2-tap or channel pixel architecture according to the present invention.

FIG. 6 illustrates the timing of the operation of the sensor. Integration of at the storage sites and data transfer from the pixel array 110 to the processing and storage (proxel) array 150 occurs in parallel. This eliminates any "dead time" caused by reading out the pixel field 110. Shown is the readout where the pixel has a 2-tap pixel architecture in which there are two storage sites 220A, 220B.

In case the pixel field readout time becomes dominant compared to the subframe integration time, the need of having integration and readout in parallel becomes important.

In more detail, for each of channel 1, associated with storage site 220A and channel 2, associated with storage site 220B, charge subframe integration occurs at each of the storage sites for 0° and 180°, respectively. At the end of the integration time, the charge carriers that have been accumulated in the storage sites are transferred to the readout nodes 221A, 221B, respectively. This typically is done simultaneously for all pixels of the pixel array and is performed in a negligible short time compared to the integration time.

At this moment, the longer pixel array or field readout is performed to the information storage sites 314 in the corresponding proxels of the proximal array 150. In one example, this readout further includes analog to digital conversion of the charge carriers stored in the readout nodes during the transfer.

During the pixel field readout, the subframe integration time at the pixel level has already begun again. In channel 1, associated with storage site 220A, and channel 2, associated with storage site 220B, charge integration occurs at each of the storage sites for 90° and 270°, respectively. The storage sites 220A, 220B are accumulating the charge carriers associated with the next subframe integration time.

This process repeats to generate the four samples. In the given example, four sub-frames are acquired to derive one sub-depth-frame. In the most typical example, this process is repeated over, including many sub-depth frames. At the end of the full acquisition, the full frame is then read out from the proxel array 150. Preferably the depth calculation and off-chip readout are then performed.

In a more sophisticated timing control, the sub-frame or the sub-depth-frame integration time might even vary between different cycles with the purpose to cover a bigger dynamic range.

While this invention has been particularly shown and described with references to preferred embodiments thereof, it will be understood by those skilled in the art that various changes in form and details may be made therein without departing from the scope of the invention encompassed by the appended claims.

What is claimed is:

1. A demodulation sensor, comprising:
   a pixel array comprising pixels that each produce at least two samples for subframes; and
   a storage array comprising storage elements, each of the storage elements receiving the at least two samples from a corresponding one of the pixels;
   wherein the pixels each comprises storage sites and readout nodes in which charge carriers of the samples are integrated in the storage sites and then transferred to the readout nodes for readout to the storage array.

2. A demodulation sensor as claimed in claim 1, wherein storage sites integrate charge carriers while the charge carriers are being readout from the readout nodes.

3. A demodulation sensor as claimed in claim 1, wherein storage sites integrate charge carriers for a current integration time while the charge carriers are being readout from the readout nodes from a previous integration time.

4. A demodulation sensor as claimed in claim 1, wherein the charge carriers are transferred to the readout nodes simultaneously for the entire pixel array.

5. A demodulation sensor as claimed in claim 4, wherein readout of the pixel array to the storage array is performed row-wise.

6. A demodulation sensor as claimed in claim 1, wherein the samples of the charge carriers are analog to digitally converted during readout of the pixel array to the storage array.

7. A demodulation sensor as claimed in claim 1, wherein the storage array accumulates the subframe into sub-depth frames.

8. A demodulation sensor as claimed in claim 7, wherein the storage array accumulates the sub-depth frames into full frames.

9. A demodulation sensor as claimed in claim 8, further comprising performing depth calculations on the full frames.

10. A demodulation sensor as claimed in claim 8, further comprising reading out the full frames off chip.

11. A demodulation sensor as claimed in claim 1, wherein the sub-frame or the sub-depth-frame integration time might vary between different full frames.

12. A demodulation sensor as claimed in claim 1, herein the sub-frame or the sub-depth-frame integration time might vary with the same full frame integration time.

13. A demodulation method, comprising:
   producing at least two samples with a pixel array in storage sites;
   transferring the samples to readout nodes within each of the pixels in the pixel array; and
   reading out the samples from the readout nodes to a storage array.

14. A demodulation method as claimed in claim 13, further comprising integrating charge carriers within storage sites while the charge carriers are being readout from the readout nodes.

15. A demodulation method as claimed in claim 13, further comprising integrating charge carriers within storage sites for a current subframe integration time while the charge carriers are being readout from the readout nodes from a previous subframe integration time.

16. A demodulation method as claimed in claim 13, further comprising transferring charge carriers to the readout nodes simultaneously for the entire pixel array.

17. A demodulation method as claimed in claim 16, further comprising reading out the pixel array to the storage array row-wise.

* * * * *